(12) United States Patent
Poplack et al.

(10) Patent No.: US 7,640,155 B2
(45) Date of Patent: Dec. 29, 2009

(54) EXTENSIBLE MEMORY ARCHITECTURE AND COMMUNICATION PROTOCOL FOR SUPPORTING MULTIPLE DEVICES IN LOW-BANDWIDTH, ASYNCHRONOUS APPLICATIONS

(75) Inventors: Mitchell G. Poplack, San Jose, CA (US); John A. Maher, San Jose, CA (US)

(73) Assignee: QuickTurn Design Systems, Inc., San Jose, CA (US)

( * ) Notice: Subject to any disclaimer, the term of this patent is extended or adjusted under 35 U.S.C. 154(b) by 784 days.

(21) Appl. No.: 11/141,599

(22) Filed: May 31, 2005

(65) Prior Publication Data

US 2005/0267729 A1 Dec. 1, 2005

Related U.S. Application Data

(60) Provisional application No. 60/576,611, filed on Jun. 1, 2004, provisional application No. 60/576,691, filed on Jun. 1, 2004.

(51) Int. Cl.
| | |
|---|---|
| G06F 17/50 | (2006.01) |
| G06F 9/455 | (2006.01) |
| G06F 12/00 | (2006.01) |
| G06F 15/76 | (2006.01) |
| G06F 11/00 | (2006.01) |
| G06F 9/45 | (2006.01) |

(52) U.S. Cl. .............................. 703/23; 703/13; 703/24; 703/28; 711/122; 712/2; 712/10; 712/20; 712/22; 712/39; 714/28; 714/735; 716/4; 716/5; 716/16; 716/17

(58) Field of Classification Search .................... 703/23, 703/28, 24, 13; 714/28; 716/4, 5, 16, 17; 711/1, 20, 22, 10, 39; 712/122
See application file for complete search history.

(56) References Cited

U.S. PATENT DOCUMENTS

| | | | | |
|---|---|---|---|---|
| 4,899,306 | A | * | 2/1990 | Greer ........................... 710/64 |
| 5,109,353 | A | | 4/1992 | Sample et al. .............. 364/578 |
| 5,126,966 | A | | 6/1992 | Hafeman et al. ............ 364/500 |
| 5,228,039 | A | * | 7/1993 | Knoke et al. .................. 714/28 |

(Continued)

OTHER PUBLICATIONS

Bonney et al. "Distributed Hardware Support for Process Synchronization in NSM Workstation Clusters", 1997.*

(Continued)

Primary Examiner—Kamini S Shah
Assistant Examiner—Shambhavi Patel
(74) Attorney, Agent, or Firm—Orrick, Herrington & Sutcliffe LLP

(57) ABSTRACT

A target interface system for interfacing selected components of a communication system and methods for manufacturing and using same. The target interface system includes target interface logic that is distributed among a plurality of reconfigurable logic devices. Being coupled via a serial link, the reconfigurable logic devices each have an input connection for receiving incoming data packets and an output connection for providing outgoing data packets. The serial link couples the input and output connections of successive reconfigurable logic devices to form a dataring structure for distributing the data packets among the reconfigurable logic devices. Thereby, the dataring structure maintains data synchronization among the reconfigurable logic devices such that the distribution of the target interface logic among the reconfigurable logic devices is transparent to software.

21 Claims, 7 Drawing Sheets

U.S. PATENT DOCUMENTS

| | | | |
|---|---|---|---|
| 5,377,124 A | 12/1994 | Mohsen | 364/489 |
| 5,414,638 A | 5/1995 | Verheyen et al. | 364/489 |
| 5,475,830 A | 12/1995 | Chen et al. | 395/500 |
| 5,477,475 A * | 12/1995 | Sample et al. | 716/16 |
| 5,544,069 A | 8/1996 | Mohsen | 364/489 |
| 5,551,013 A | 8/1996 | Beausoleil et al. | 703/23 |
| 5,574,388 A | 11/1996 | Barbier et al. | 326/41 |
| 5,596,742 A | 1/1997 | Agarwal et al. | 395/500 |
| 5,649,176 A | 7/1997 | Selvidge et al. | 395/551 |
| 5,654,564 A | 8/1997 | Mohsen | 251/209 |
| 5,659,716 A | 8/1997 | Selvidge et al. | 395/500 |
| 5,754,827 A | 5/1998 | Barbier et al. | 395/500 |
| 5,761,484 A | 6/1998 | Agarwal et al. | 395/500 |
| 5,777,489 A | 7/1998 | Barbier et al. | 326/40 |
| 5,790,832 A | 8/1998 | Barbier et al. | 395/500 |
| 5,802,348 A | 9/1998 | Stewart et al. | 395/500 |
| 5,822,564 A | 10/1998 | Chilton et al. | 395/500 |
| 5,847,578 A | 12/1998 | Noakes et al. | 326/39 |
| 5,850,537 A | 12/1998 | Selvidge et al. | 395/500 |
| 5,854,752 A | 12/1998 | Agarwal | 364/489 |
| 5,884,066 A | 3/1999 | Kuijsten | 395/500 |
| 5,920,712 A | 7/1999 | Kuijsten | 395/500 |
| 5,940,603 A | 8/1999 | Huang | |
| 5,963,736 A | 10/1999 | Sarno et al. | 395/500.48 |
| 6,020,760 A | 2/2000 | Sample et al. | 326/41 |
| 6,034,857 A | 3/2000 | Sample et al. | 361/93.2 |
| 6,035,117 A | 3/2000 | Beausoleil et al. | 703/25 |
| 6,051,030 A | 4/2000 | Beausoleil et al. | 703/20 |
| 6,058,492 A | 5/2000 | Sample et al. | 714/33 |
| 6,106,565 A * | 8/2000 | Stapleton et al. | 703/23 |
| 6,141,636 A * | 10/2000 | Sarno et al. | 703/23 |
| 6,173,419 B1 * | 1/2001 | Barnett | 714/28 |
| 6,175,248 B1 | 1/2001 | Mack | |
| 6,223,148 B1 | 4/2001 | Stewart et al. | 714/33 |
| 6,259,588 B1 | 7/2001 | Sample et al. | 361/93.2 |
| 6,272,451 B1 * | 8/2001 | Mason et al. | 703/13 |
| 6,285,211 B1 | 9/2001 | Sample et al. | 326/41 |
| 6,377,912 B1 | 4/2002 | Sample et al. | 703/28 |
| 6,499,122 B1 | 12/2002 | Coomes | |
| 6,583,647 B2 | 6/2003 | Kim et al. | |
| 6,587,995 B1 * | 7/2003 | Duboc et al. | 716/4 |
| 6,618,698 B1 | 9/2003 | Beausoleil et al. | 703/23 |
| 6,668,361 B2 * | 12/2003 | Bailis et al. | 716/4 |
| 6,681,377 B2 | 1/2004 | Beletsky | 716/6 |
| 6,694,464 B1 | 2/2004 | Quayle et al. | 714/725 |
| 6,697,957 B1 | 2/2004 | Wang et al. | 713/401 |
| 6,779,140 B2 | 8/2004 | Krech | |
| 6,842,729 B2 | 1/2005 | Sample et al. | 703/24 |
| 6,850,880 B1 | 2/2005 | Beausoleil et al. | 703/23 |
| 6,901,359 B1 | 5/2005 | Beausoleil et al. | 703/24 |
| 7,093,051 B2 | 8/2006 | Haig et al. | |
| 2002/0052729 A1 * | 5/2002 | Kyung et al. | 703/28 |
| 2002/0116168 A1 * | 8/2002 | Kim | 703/28 |
| 2003/0191623 A1 * | 10/2003 | Salmonsen | 703/24 |
| 2005/0083996 A1 | 4/2005 | Robinson et al. | |
| 2006/0044018 A1 | 3/2006 | Chang | |
| 2007/0186261 A1 | 8/2007 | Geile et al. | |
| 2007/0230611 A1 | 10/2007 | Sorrells et al. | |

OTHER PUBLICATIONS

Barroso et al. "RPM: A Rapid Prototyping Engine for Multiprocessor Systems", IEEE 1995.*
Burns, et al. "A Dynamic Reconfiguration Run-Time System", 1997.*
Tessier et al. "The Virtual Wires Emulation System: A Gate-Efficient ASIC Prototyping Environment", 2001.*
McGregor et al. "Extending Dynamic Circuit Switching to Meet the Challenges of New FPGA Architectures", 1997.*
Office Action, U.S. Appl. No. 11/140,714, Aug. 7, 2007.
Office Action, U.S. Appl. No. 11/140,714, Mar. 27, 2008.
Office Action, U.S. Appl. No. 11/140,714, Dec. 8, 2008.
Office Action, U.S. Appl. No. 11/140,714, Mar. 20, 2009.
Advisory Action, U.S. Appl. No. 11/140,714, May 27, 2009.
Office Action, U.S. Appl. No. 11/140,722, Mar. 18, 2008.
Office Action, U.S. Appl. No. 11/140,722, Jun. 13, 2008.
Office Action, U.S. Appl. No. 11/141,141, Oct. 31, 2007.
Office Action, U.S. Appl. No. 11/141,141, Jul. 9, 2008.
Office Action, U.S. Appl. No. 11/141,141, Nov. 28, 2008.
Office Action, U.S. Appl. No. 11/141,141, Jun. 10, 2009.
"1.4 System Timing", 2000 Webster Art of Assembly, retrieved from the Internet on Jul. 21, 2009 at http://webster.cs.ucr.edu/AoA/Linux/HTML/SystemOrganizationa4.html, pp. 1-8.

* cited by examiner

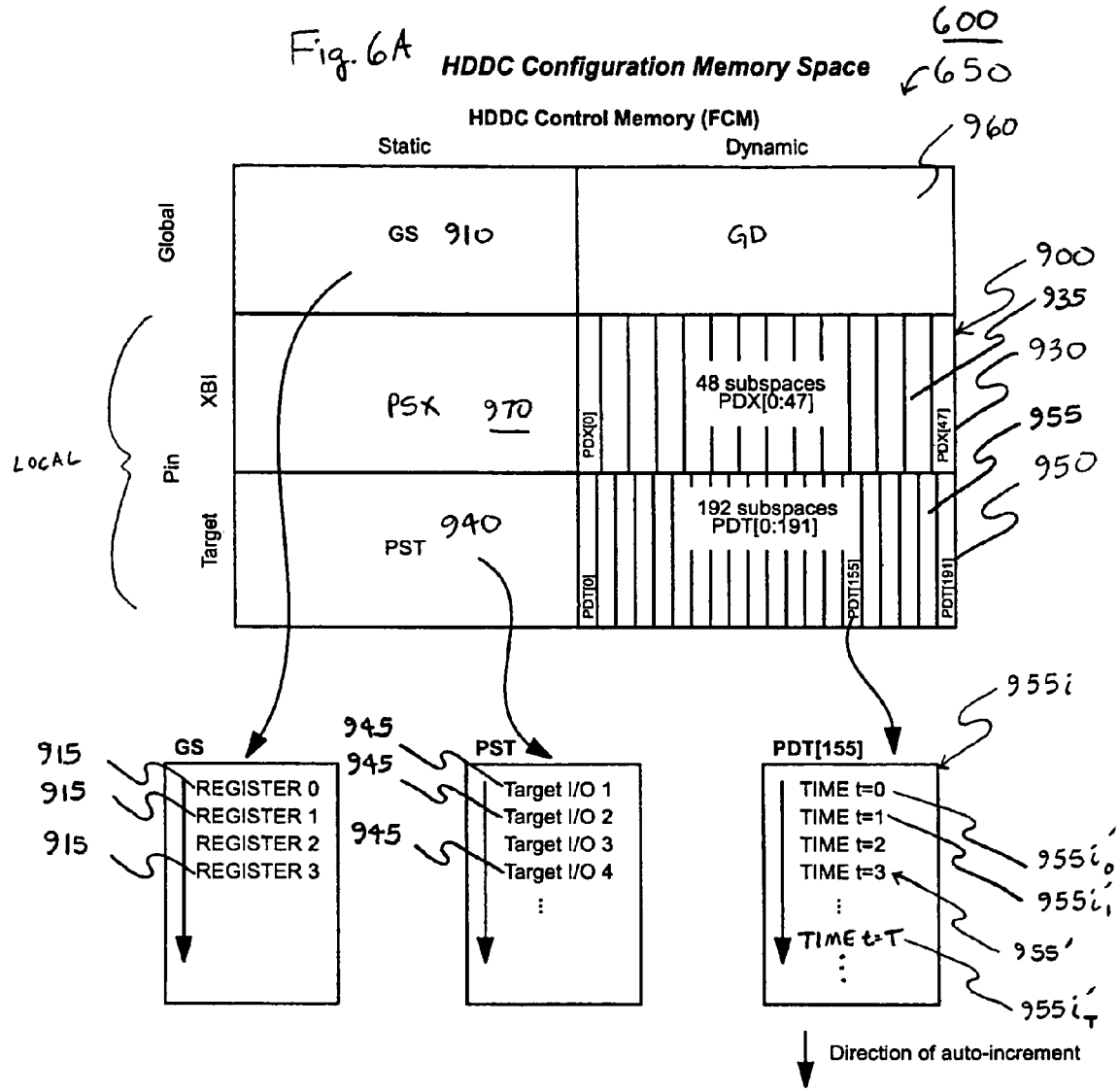

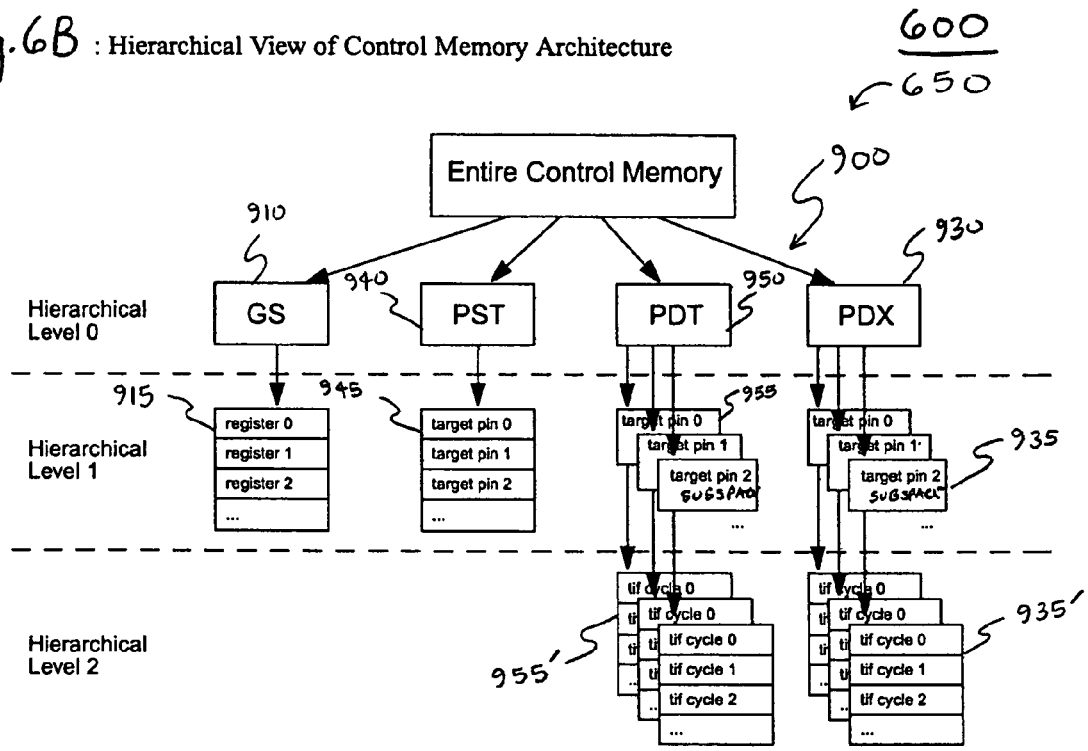
Fig. 6B: Hierarchical View of Control Memory Architecture

Fig. 7A: Configuration Interface JTAG Registers
*Hardware Implementation*
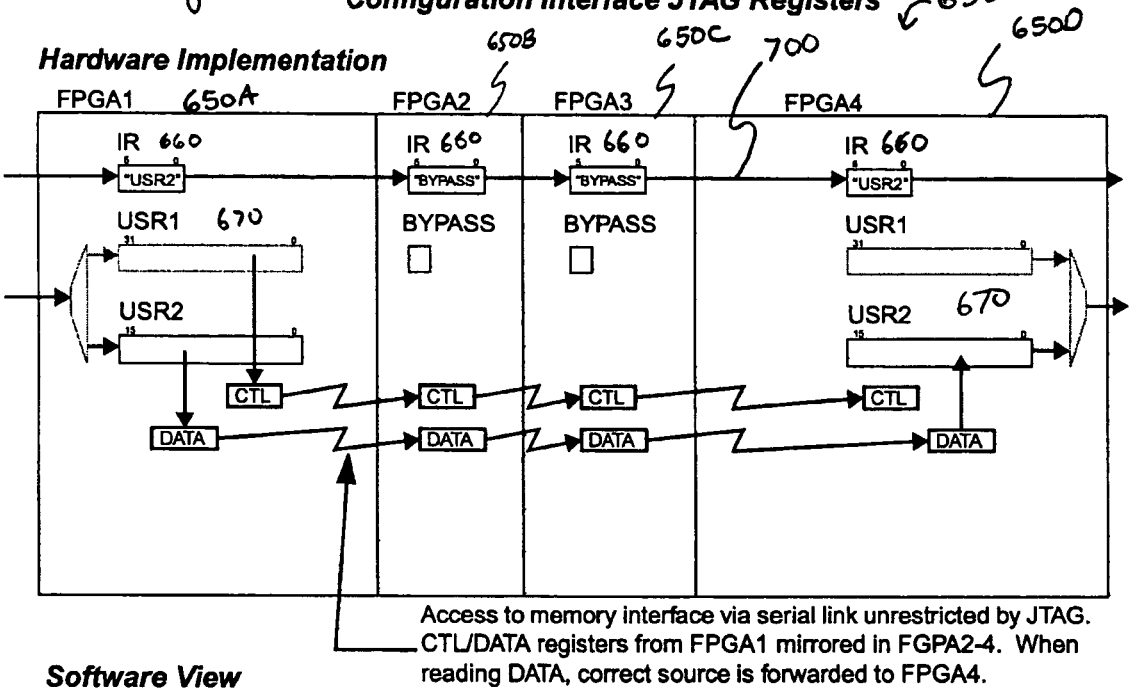
Access to memory interface via serial link unrestricted by JTAG. CTL/DATA registers from FPGA1 mirrored in FGPA2-4. When reading DATA, correct source is forwarded to FPGA4.
*Software View*
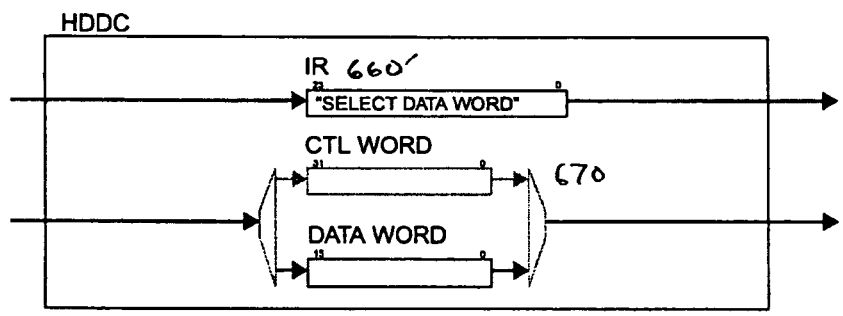
Fig. 7B

EXTENSIBLE MEMORY ARCHITECTURE AND COMMUNICATION PROTOCOL FOR SUPPORTING MULTIPLE DEVICES IN LOW-BANDWIDTH, ASYNCHRONOUS APPLICATIONS

CROSS-REFERENCE TO RELATED APPLICATIONS

This application claims priority to U.S. Provisional Application Ser. No. 60/576,611 and U.S. Provisional Application Ser. No. 60/576,691, each being filed on Jun. 1, 2004. Priority to these prior applications is expressly claimed, and the disclosures of respective applications are hereby incorporated by reference in their entireties.

FIELD

The present invention relates generally to hardware emulation systems for verifying electronic circuit designs and more particularly, but not exclusively, to interface systems for coupling such hardware emulation systems with other system components in emulation.

BACKGROUND

Emulation systems are used to verify electronic circuit designs prior to fabrication as chips or manufacture as electronic systems. Typical emulation systems utilize either interconnected programmable logic chips or interconnected processor chips. Examples of hardware logic emulation systems using programmable logic devices can be seen in, for example, U.S. Pat. Nos. 5,109,353, 5,036,473, 5,475,830 and 5,960,191. U.S. Pat. Nos. 5,109,353, 5,036,473, 5,475,830 and 5,960,191 are incorporated herein by reference. Examples of hardware logic emulation systems using processor chips can be seen in, for example, U.S. Pat. Nos. 5,551,013, 6,035,117 and 6,051,030. U.S. Pat. Nos. 5,551,013, 6,035,117 and 6,051,030 are incorporated herein by reference.

The design under test is usually provided in the form of a netlist description of the design. The netlist may have been derived from many sources, including from a hardware description language. A netlist description (or "netlist" as it is referred to by those of ordinary skill in the art) is a description of the circuit's components and electrical interconnections between the components. The components include all those circuit elements necessary for implementing a logic circuit, such as combinational logic (e.g., gates) and sequential logic (e.g., flip-flops and latches). In prior art emulation systems, the netlist is compiled such that it is placed in a form that can be used by the emulation system. In an FPGA-based emulator, the DUV is compiled into a form that allows the logic gates (both sequential and combinational) to be implemented in the FPGAs. In a processor-based emulation system, the DUV is compiled into a series of statements that will be executed by the processors on the processor chips. No logic is implemented into these processors.

Conventional hardware emulation systems include target interface systems for coupling with one or more user testbenches and/or target systems. A "target system" is, generally speaking, the actual operating environment that the DUV, once manufactured, will be installed. Thus, the target system for a microprocessor DUV can be a personal computer. A "testbench," in this context, is an application that may apply a set of stimuli (such as a test vector) to a model to produce a set of information used in analyzing the timing or performance of a system block. The target interface systems of these hardware emulation systems suffer from several limitations. For example, the input/output (I/O) technologies employed by such target interface systems are not suitable for supporting differential signaling technologies. Connection to a differential target system requires the use of additional technology conversion hardware, which generally must be custom made. The design under test thereby is required to expose a single logical signal as a primary I/O (as opposed to possibly two nets), requiring manual intervention into the netlist of the design.

Other disadvantages of the target interface systems of conventional hardware emulation systems include the use of fixed input/output (I/O) technologies. The target interface systems likewise provide limited I/O timing control as well as a limited number of directional signals for bidirectional signals. Further, conventional target interface systems cannot verify the validity of the I/O voltage of the target system and are unable to detect whether the target system is powered on, powered off, or unconnected.

In view of the foregoing, a need exists for an improved hardware emulation system that overcomes the aforementioned obstacles and deficiencies of currently-available hardware emulation systems.

BRIEF DESCRIPTION OF THE DRAWINGS

FIG. 6A is a block diagram illustrating an exemplary configuration memory space of the field-programmable gate arrays forming the dataring structure of FIG. 4.

FIG. 6B is a block diagram illustrating the hierarchical nature of the exemplary configuration memory space of FIG. 6A.

FIG. 7A is a block diagram illustrating a hardware view of the configuration interface registers of the field-programmable gate arrays of FIG. 3.

FIG. 7B is a block diagram illustrating a software view of the configuration interface registers of FIG. 7A, in which the configuration interface registers permit the field-programmable gate arrays to appear as a single logical (or virtual or composite) device.

Figure 1:
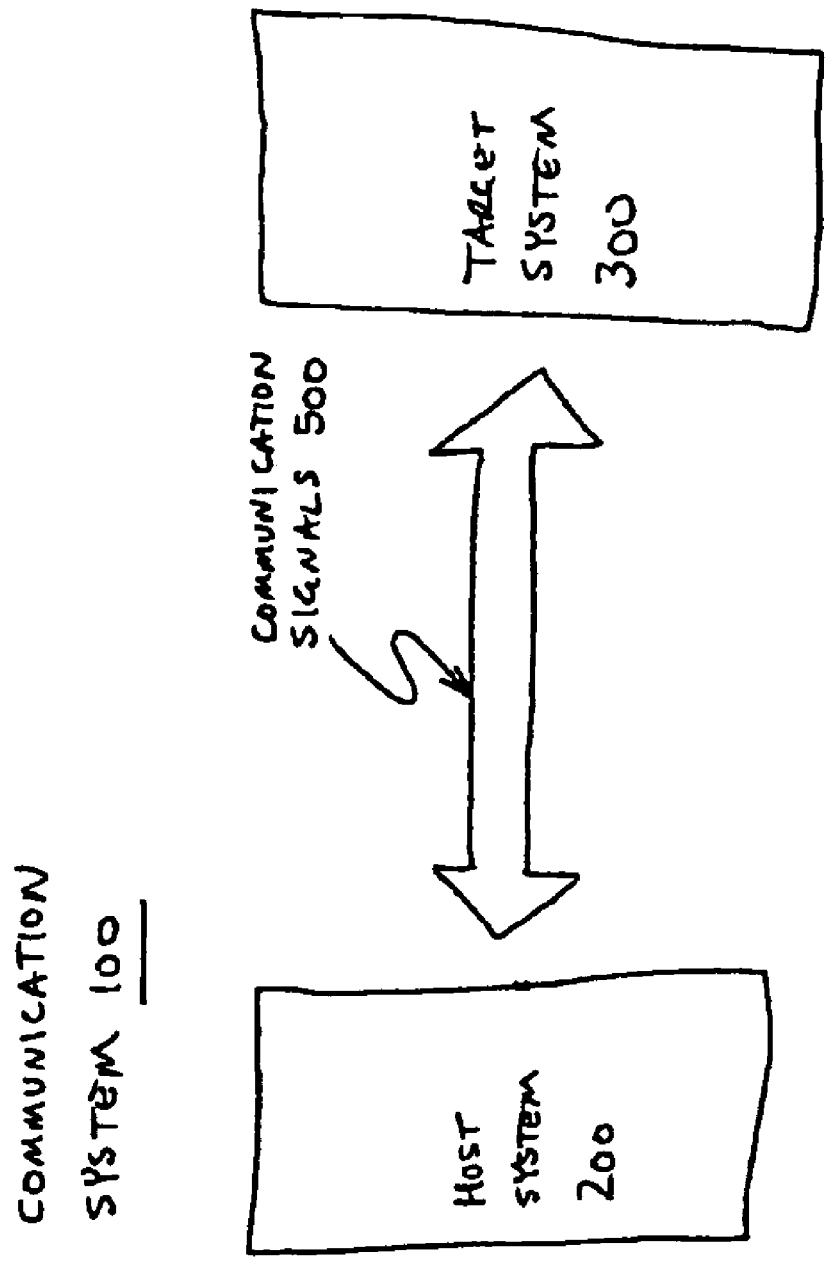
FIG. 1 is an exemplary top-level block diagram illustrating an embodiment of a communication system in which the communication system includes a host system and a target system.

It should be noted that the figures are not drawn to scale and that elements of similar structures or functions are generally represented by like reference numerals for illustrative purposes throughout the figures. It also should be noted that the figures are only intended to facilitate the description of the preferred embodiments of the present invention. The figures do not describe every aspect of the present invention and do not limit the scope of the invention.

DETAILED DESCRIPTION OF THE DRAWINGS

Since conventional hardware emulation systems suffer from several limitations, such as limited I/O timing control and limited memory resources that are not readily adaptable for use with diverse varieties of target system applications, a target interface system that can be partitioned among a plurality of devices while employing a communication protocol to provide data synchronization such that the devices appear as a single logical (or virtual or composite) device can prove much more desirable and provide a basis for a wide range of system applications, such as hardware emulation systems. In addition, a communication system that includes a target interface system having a hierarchical memory structure that is flexibly extensible and supports auto-incrementing functionality can also prove much more desirable. This result can be achieved, according to one embodiment disclosed herein, by employing a communication system 100 as shown in FIG. 1.

The communication system 100 can be provided in any suitable manner, including the manner disclosed in co-pending U.S. patent application, entitled "SYSTEM AND METHOD FOR CONFIGURING COMMUNICATION SYSTEMS," Ser. No. 10/992,165, filed on Nov. 17, 2004, which is assigned to the assignee of the present application and the disclosure of which is hereby incorporated herein by reference in its entirety. As shown in FIG. 1 herein, the exemplary communication system 100 can comprise a host system 200 and at least one target system 300. Typically being coupled via one or more communication cable assemblies 400 (shown in FIG. 2), the host system 200 and each target system 300 are configured to communicate such that communication signals 500 can be exchanged among the host system 200 and the target systems 300.

Figure 2:
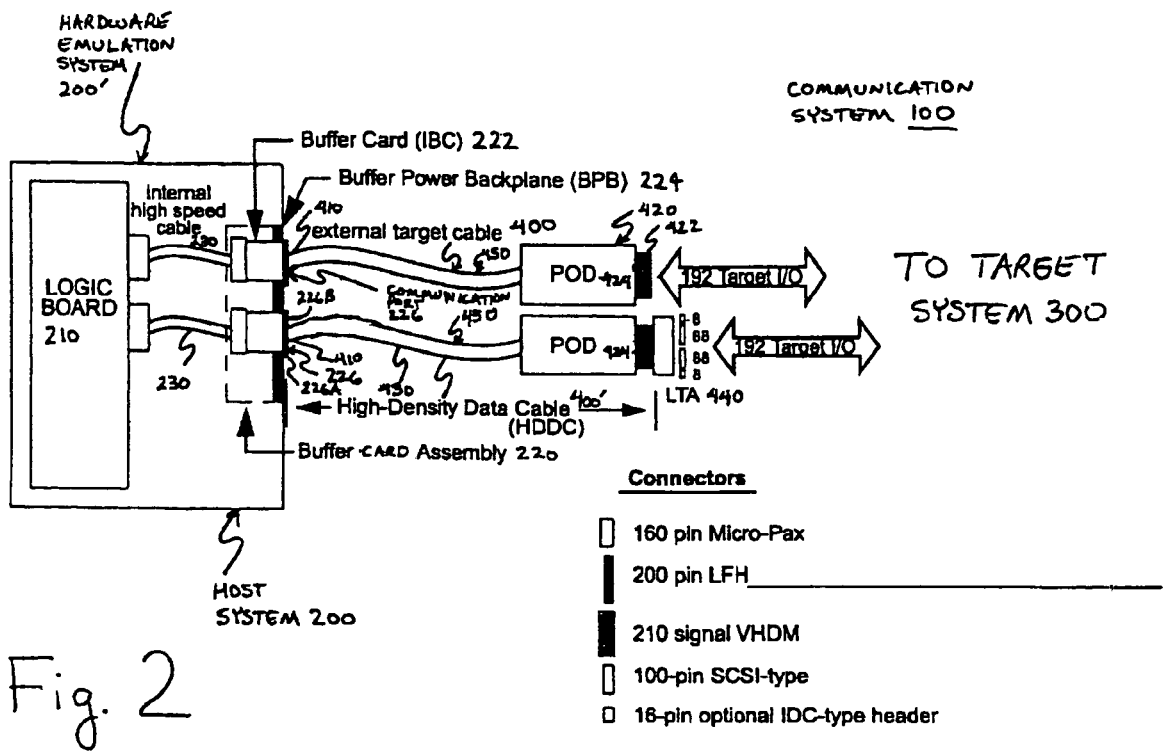
FIG. 2 is an exemplary block diagram illustrating an embodiment of the communication system of FIG. 1 in which the communication system comprises a hardware emulation system for developing one or more components of the target system.

Turning to FIG. 2, the communication system 100 is illustrated as comprising a hardware emulation system 200', such as an accelerator, a simulator, and/or an emulator, for developing the target system 300 and/or one or more components of the target system 300. Prior to manufacture of an integrated circuit, designers generally verify the functionality of their designs (referred to herein as the "design under verification"). The communication system 100 therefore preferably is provided as a hardware emulation system 200' to allow the designers to verify that a design under verification will function in the system in which the integrated circuit will eventually reside (i.e., the target system 300). Exemplary hardware emulation systems include the Palladium acceleration/emulation system and the NC-Sim simulation system each produced by Cadence Design Systems, Inc., of San Jose, CA.

Further details and features relating to the structure and operation of the communication system 100 and/or the hardware emulation system 200' are disclosed in the following co-pending U.S. Patent Applications filed on the same date herewith: "SYSTEM AND METHOD FOR PROVIDING FLEXIBLE SIGNAL ROUTING AND TIMING," application Ser. No. 11/140,714; "SYSTEM AND METHOD FOR RELIABLY SUPPORTING MULTIPLE SIGNALING TECHNOLOGIES," application Ser. No. 11/140,722; and "SYSTEM AND METHOD FOR RESOLVING ARTIFACTS IN DIFFERENTIAL SIGNALS," Application Ser. No. 11/141,141, which are assigned to the assignee of the present application and the respective disclosures of which are hereby incorporated herein by reference in their entireties.

The hardware emulation system 200' shown in FIG. 2 includes a logic board 210 and a buffer card assembly 220. The logic board 210 is a printed circuit board carrying either logic devices and interconnect devices or processor chips. Illustrated as being coupled with the logic board 210 via one or more internal high-speed communication cables 230, the buffer card assembly 220 provides an input/output (I/O) system for the hardware emulation system 200'. The buffer card assembly 220 includes at least one interface buffer card 222 for providing buffering to electrically protect the emulation modules of the logic board 210 from external effects and a buffer power backplane 224. Preferably providing power to each interface buffer card 222, the buffer power backplane 224 likewise provides information regarding the location of each interface buffer card 222 for the purposes of configuration detection and verification.

The target system 300 likewise can include other peripheral systems and subsystems of the hardware emulation system 200', as desired. Because such emulated representations allow a circuit designer flexibly to operate or develop the target system 300 coupled to the emulated representation, even before the prototype circuit design or hardware is actually manufactured, overall design time and cost is reduced significantly. As desired, other peripheral systems (not shown), such as one or more additional hardware or software development platforms, computers, and/or test equipment, also may be coupled with the host system 200 and/or the target system 300. By providing an emulation environment for the target system 300, the host system 200 can perform functional verification for all of, or at least one component of, the target system 300 in any appropriate manner. The host system 200, for instance, can provide co-simulation and/or simulation acceleration and/or can be configured for in-circuit use. The host system 200 likewise can provide a platform for performing hardware and software co-verification for the target system 300.

For example, the target system 300 can include a logic circuit and can be assembled, along with one or more electronic components, such as integrated components and/or discrete components, on a hardware development platform (not shown) in the manner known in the art. Exemplary logic circuits can include reconfigurable logic circuits, such as one or more field-programmable gate arrays (FPGAs), and/or non-reconfigurable logic circuits, such as one or more application-specific integrated circuits (ASICs). Once assembled, the reconfigurable logic circuit can be customized to implement a user design by loading configuration data into the reconfigurable logic circuit. By programming the internal memory cells, a customized configuration is established within the reconfigurable logic circuit. Thereby, the user design can be implemented by the reconfigurable logic circuit and evaluated by operating the reconfigurable logic circuit on the hardware development platform and in conjunction with the hardware emulation system and any other peripheral systems.

Each interface buffer card 222 includes at least one communication port 226 for coupling the hardware emulation system 200' with one or more target systems 300, communication cable assemblies 400, and/or other external systems or devices. Each communication port 226 includes a connector assembly 226A having a plurality of contacts, pins, or terminals 226B, such as user-definable terminals and/or reserved terminals. Each communication port 226 can have any appropriate number of terminals 226B, which number can be related to the number of communication signals 500 (shown in FIG. 1) to be supported by the communication port 226. The communication signals 500 thereby can be exchanged among the hardware emulation system 200' with one or more target systems 300, communication cable assemblies 400, and/or other external systems or devices, as desired.

The buffer card assembly 220 of the hardware emulation system 200' is illustrated in FIG. 2 as being configured to couple with the target systems 300 via communication cable assemblies 400. Therefore, the buffer card assembly 220 and the communication cable assemblies 400 can form a target interface system 450 for coupling the hardware emulation system 200' and the target systems 300. Although any suitable type of communication cable assemblies 400 can be used to couple the hardware emulation system 200' with the target systems 300, the communication cable assemblies 400 preferably comprise at least one high-density data cable 400' and/or at least one direct attach stimulus cable (not shown).

As shown in FIG. 2, each of the high-density data cables 400' can include an emulator connector assembly 410 and a target connector assembly 420 that are coupled via a communication cable 430. Although shown and described as being provided adjacent to the opposite end regions of the communication cable 430 for purposes of illustration, the emulator connector assembly 410 and the target connector assembly 420 can be associated with any suitable portion, such as an intermediate region, of the communication cable 430 and can be provided in any suitable manner. Being configured to couple with, and/or mate with, communication ports (not shown) of the target systems 300, the target connector assembly 420 is illustrated as comprising a connector assembly 422 and an interface system (or pod) 424. The interface system (or pod) 424 can include analog and/or digital devices and is configured to perform one or more functions associated with the target interface system 450. Preferably, the bulk of the functions associated with the target interface system 450 are performed by the interface system (or pod) 424.

As desired, a legacy target adapter 440 can disposed between the target connector assembly 420 and the target systems 300 as illustrated in FIG. 2. The legacy target adapter 440 can be configured to provide back-compatibility to the legacy form factor for conventional target systems 300, such as conventional target systems 300 supported by Cadence Design Systems, Inc., of San Jose, CA. In the manner discussed above with regard to the target connector assembly 420, the emulator connector assembly 410 can include a connector assembly (not shown) for coupling with, and/or mating with, the communication ports 226 of the hardware emulation system 200'. Thereby, the hardware emulation system 200' and the target systems 300 can be coupled, and configured to communicate, such that the communication signals 500 are exchanged via the communication cable assemblies 400.

Figure 3:
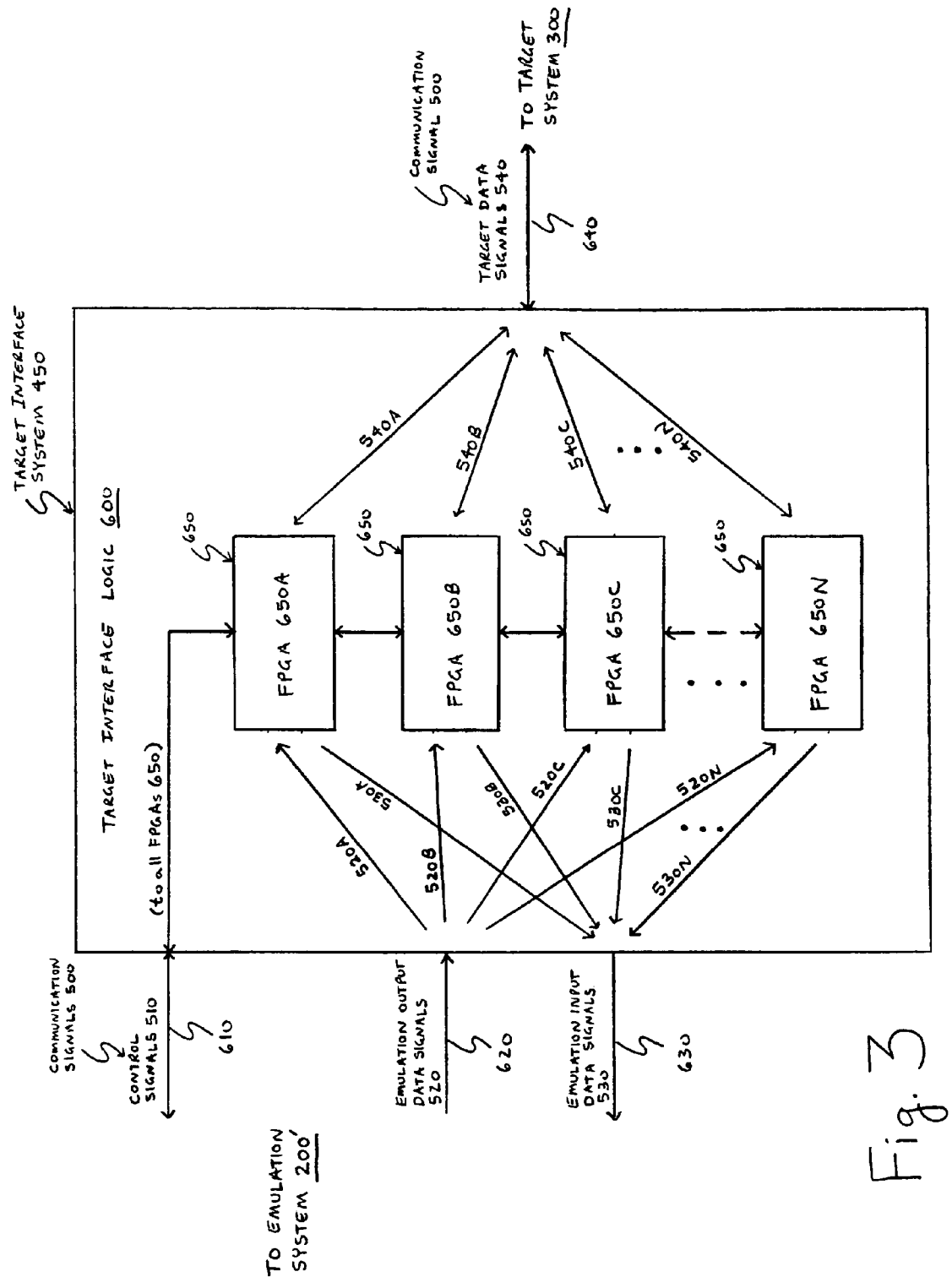
FIG. 3 is an exemplary block diagram illustrating an embodiment of a target interface system for the communication systems of FIGS. 1 and 2 in which the target interface system includes target interface logic that comprises a plurality of field-programmable gate arrays.

In the manner set forth in more detail in co-pending United States Patent Application, entitled "SYSTEM AND METHOD FOR PROVIDING FLEXIBLE SIGNAL ROUTING AND TIMING," application Ser. No.11/140,714, the target interface system 450 can include target interface logic 600 for facilitating exchanges of communication signals 500 between the hardware emulation system 200' and the target system 300 as shown in FIG. 3. Being coupled with, and configured to communicate with, the hardware emulation system 200' and the target system 300, the target interface logic 600 can exchange communication signals 500 with the hardware emulation system 200' and the target system 300. For example, the target interface logic 600 includes one or more control signal connections (or pins) 610 for exchanging control signals 510 with the hardware emulation system 200'.

The target interface logic 600 likewise is illustrated as including at least one emulator data output connections (or pins) 620 for receiving emulator output data signals 520 from the hardware emulation system 200' and at least one emulator data input connections (or pins) 630 for providing emulator input data signals 530 to the hardware emulation system 200'. One or more target I/O connections (or pins) 640 are shown in FIG. 3 whereby the target interface logic 600 and the target system 300 can exchange target data signals 540. Comprising configurable (or reconfigurable) as input connections, output connections, and/or bidirectional connections, the target I/O connections 640 can be configured, as desired, to provide the target data signals 540 to the target system 300 and/or to receive the target data signals 540 from the target system 300. Thereby, the target interface logic 600 can facilitate the exchange of communication signals 500 between the emulation system 200' and the target system 300.

The target interface logic 600 can be provided in any conventional manner and, as shown in FIG. 3, preferably comprises one or more reconfigurable logic devices, such as field-programmable gate arrays (FPGAS) 650 and/or logic cell arrays (LCAs). Exemplary field-programmable gate arrays 650 include the XC4000 FPGA family, which is commercially available from Xilinx, Inc. in San Jose, CA. Each field-programmable gate array 650 includes a plurality of programmable input/output blocks (not shown) for receiving/sending signals and a plurality of programmable logic blocks (not shown). The programmable logic blocks preferably comprise a plurality of combinational logic elements and/or sequential logic elements.

The field-programmable gate arrays 650 likewise include electrical interconnection segments (not shown) and programmable switch blocks (not shown) for activating/de-activating interconnections between the input/output blocks and the programmable logic blocks. By configuring different interconnection paths, the input/output blocks can be coupled with selected programmable logic blocks, which, in turn, are connectable to specified further programmable logic blocks for each of the field-programmable gate array 650. The programmable logic blocks each likewise can be programmed to perform selected operations. The field-programmable gate arrays 650 thereby can implement predetermined functions by appropriately connecting the input/output blocks and the configured programmable logic blocks within each field-programmable gate array 650.

Any suitable number of field-programmable gate arrays 650 can be applied to implement the target interface logic 600 because the required quantity of programmable logic is relatively small and can reduce overall system costs. The field-programmable gate arrays 650 can be programmed via the hardware emulation system 200' (shown in FIG. 2) and are designed such that each field-programmable gate array 650 is programmed with the same file and at the same time. Thereby, the field-programmable gate arrays 650 effectively operate as a single logical (or composite) field-programmable gate array, and the distribution of the target interface logic 600 among the field-programmable gate arrays 650 is transparent to software.

When the target interface logic 600 comprises a plurality of field-programmable gate arrays 650A-N as illustrated in FIG. 3, the control signals 510 are provided to each of the field-programmable gate arrays 650A-N. The emulator output data signals 520 and the emulator input data signals 530, in contrast, are distributed among the field-programmable gate arrays 650A-N. For example, the emulator output data signals 520 and the emulator input data signals 530 can be respectively divided into groups 520A-N of emulator output data signals 520 and groups 530A-N of emulator input data signals 530. Each group 520A-N can include any suitable number of the emulator output data signals 520; whereas, any appropriate number of the emulator input data signals 530 can be associated with each group 530A-N. The number of the emulator output data signals 520 and the emulator input data signals 530 associated with each of the groups 520A-N, 530A-N, respectively, can be uniform, or different, as desired.

As shown in FIG. 3, the field-programmable gate array 650A can receive the emulator output data signals 520 in the first group 520A from the hardware emulation system 200' as well as provide the emulator input data signals 530 in the first group 520A to the hardware emulation system 200'. The second group 520B of emulator output data signals 520 and the second group 530B of emulator input data signals 530 are illustrated as being exchanged between the hardware emulation system 200' and the field-programmable gate array 650B. The hardware emulation system 200' and the field-programmable gate arrays 650C, 650D likewise can respectively exchange the emulator output data signals 520 in the third and fourth groups 520C, 520D and the emulator input data signals 530 in the third and fourth groups 530C, 530D as set forth in more detail above.

In a similar manner, the target data signals 540 likewise can be divided into groups 540A-N of target data signals 540 when the target interface logic 600 comprises more than one field-programmable gate array 650. The target data signals 540 thereby can be distributed among the field-programmable gate arrays 650. If the target interface logic 600 comprises the field-programmable gate arrays 650A-N as shown in FIG. 3, for example, the target data signals 540 can be divided into groups 540A-N of target data signals 540. Each group 540A-N can include any suitable number of the target data signals 540. The number of the target data signals 540 associated with each group 540A-N can be uniform, or different, as desired.

With reference to the first group 540A of target data signals 540, the field-programmable gate array 650A can provide outgoing target data signals 540 in the first group 540A to the target system 300 and can receive incoming target data signals 540 in the first group 540A from the target system 300. The target data signals 540 associated with the second group 540B can be exchanged between the field-programmable gate array 650B and the target system 300. The field-programmable gate arrays 650C, 650D and the target system 300 likewise can exchange the target data signals 540 in the third and fourth groups 540C, 540D, respectively. In the manner discussed above, the emulator output data signals 520, the emulator input data signals 530, and the target data signals 540 can be divided in any suitable manner among any appropriate number of field-programmable gate arrays 650.

Figure 4:
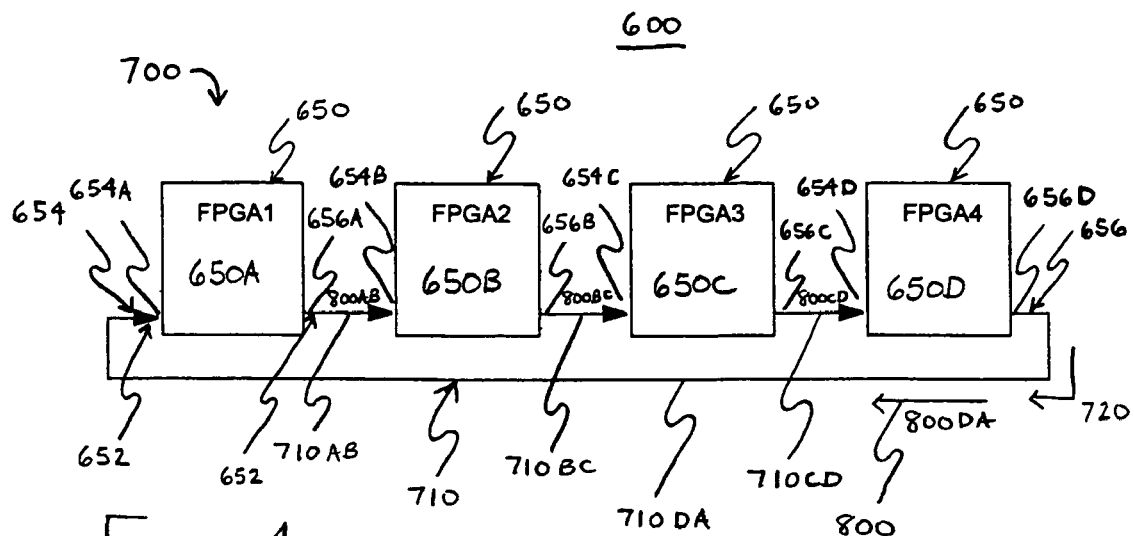
FIG. 4 is an exemplary block diagram illustrating an embodiment of a target interface system of FIG. 3 in which the field-programmable gate arrays form a dataring structure for maintaining data synchronization among the field-programmable gate arrays.

When operating as a single logical (or composite) field-programmable gate array, the field-programmable gate arrays 650A-N typically exchange data packets 800 for distributing data and other information among the field-programmable gate arrays 650A-N. To facilitate communication among the field-programmable gate arrays 650A-N, the field-programmable gate arrays 650A-N preferably form a dataring structure 700 for maintaining data synchronization among the field-programmable gate arrays 650A-N as illustrated in FIG. 4. Advantageously, the dataring structure 700 enables the field-programmable gate arrays 650A-N to maintain data synchronization via a small number of connections (or pins) 652 of the field-programmable gate arrays 650A-N. The dataring structure 700 likewise facilitates the distribution of the target interface logic 600 among the field-programmable gate arrays 650A-N in a manner that is transparent to software such that the field-programmable gate arrays 650A-N can appear as the single logical field-programmable gate array. Thereby, data can be readily broadcast to the field-programmable gate arrays 650A-N, and the field-programmable gate arrays 650A-N can communicate without requiring compensation for different shifts of the data.

In typical applications, the allocations of the pins 652 for each field-programmable gate array 650A-N is highly optimized such that very few pins 652 are available for communication among the field-programmable gate arrays 650A-N. As shown in FIG. 4, the dataring structure 700 permits the field-programmable gate arrays 650A-N to communicate via a minimum number of pins 652 per field-programmable gate array 650A-N. The dataring structure 700 can be utilized in any suitable application such as applications for communicating the data packets 800 with small amounts of data and/or unsynchronized data among the field-programmable gate arrays 650A-N. Illustrative applications include applications in which the data source comprises a slow agent (not shown), such as software or a human, and/or applications in which reaction by the field-programmable gate arrays 650A-N to the data packets 800 can be slow. The dataring structure 700 likewise can be applied to provide setup (or configuration) data to the field-programmable gate arrays 650A-N prior to normal system operation and/or to upload data from the field-programmable gate arrays 650A-N after normal system operation. As desired, status queries, such as contention status and/or power status, can be processed via the dataring structure 700.

To facilitate the timely distribution of the data packets 800 among the field-programmable gate arrays 650A-N, the dataring structure 700 preferably comprises a high-speed serial link 710. The dataring structure 700 can enable the field-programmable gate arrays 650A-N to communicate via two pins 652 per field-programmable gate array 650A-N as shown in FIG. 4. Each field-programmable gate array 650A-N includes an input connection (or pin) 654 for receiving the data packets 800 from a preceding field-programmable gate array 650A-N and an output connection (or pin) 656 for providing the data packets 800 to a succeeding field-programmable gate array 650A-N. The dataring structure 700 thereby facilitates high-speed point-to-point communication among the field-programmable gate arrays 650A-N. The field-programmable gate arrays 650A-N preferably are synchronized by at least one common clock signal (not shown), such as an in-phase clock signal, which can be distributed among the field-programmable gate arrays 650A-N. As desired, the common clock signal can be extracted from the transmitted data in the data packets 800 by any conventional clock and data recovery (CDR) method.

As illustrated in FIG. 4, the dataring structure 700 can be formed by four field-programmable gate arrays 650A-D. In the manner set forth above, each field-programmable gate array 650A-D respectively includes an input connection (or pin) 654A-D for receiving the data packets 800 and an output connection (or pin) 656A-D for providing the data packets 800. As shown in FIG. 4, the field-programmable gate arrays 650A-D form the dataring structure 700 via the high-speed serial link 710, which comprises a series of serial link segments 710AB, 710BC, 710CD, and 710DA. The first serial link segment 710AB couples the output pin 656A of the first field-programmable gate array 650A and the input pin 654B of the second field-programmable gate array 650B; whereas, the output pin 656B of the second field-programmable gate array 650B and the input pin 654C of the third field-programmable gate array 650C are coupled via the second serial link segment 710BC. The third serial link segment 710CD is illustrated as coupling the output pin 656C of the third field-programmable gate array 650C and the input pin 654D of the fourth field-programmable gate array 650D. The high-speed serial link 710 is completed by the fourth serial link segment 710DA, which couples the output pin 656D of the fourth field-programmable gate array 650D and the input pin 654A of the first field-programmable gate array 650A.

The dataring structure 700 likewise is shown as being associated with a predetermined direction 720. The data packets 800 thereby propagate around the high-speed serial link 710 and sequentially through each field-programmable gate array 650A-D in accordance with the predetermined direction 720. The common clock signal permits each field-programmable gate array 650A-D to synchronously receive one data packet 800 and transmit one data packet 800. Stated somewhat differently, when dataring structure 700 is operating, the serial link 710 typically transmits one data packet 800AB, 800BC, 800CD, and 800DA for each field-programmable gate array 650A-D forming the dataring structure 700. Although shown in FIG. 4 as being associated with the clockwise direction for purposes of illustration, the dataring structure 700 can be associated with any suitable predetermined direction 720, including a counter-clockwise direction.

FIG. 4 illustrates the data packets 800 as comprising the four data packets 800AB, 800BC, 800CD, and 800DA. In the manner discussed above, the number of data packets 800AB, 800BC, 800CD, and 800DA is equal to the number of field-programmable gate arrays 650A-D forming the dataring structure 700. For example, the second field-programmable gate array 650B is shown as receiving the first data packet 800AB from the first field-programmable gate array 650A via the first serial link segment 710AB and as providing the second data packet 800BC to the third field-programmable gate array 650C via the second link segment 710BC. The remaining field-programmable gate arrays 650A, 650C, 650D likewise respectively receive the data packets 800BC, 800CD, and 800DA and provide the data packets 800CD, 800DA, and 800AB in the same manner. By repeating the above, each data packet 800AB, 800BC, 800CD, and 800DA propagates around the dataring structure 700 and is transmitted to each field-programmable gate array 650A-D. Although shown and described as comprising four field-programmable gate arrays 650A-D for purposes of illustration, the dataring structure 700 can include any suitable number of field-programmable gate arrays 650A-N.

The field-programmable gate arrays 650A-D can provide additional functionality, such as an initialization function and/or a configuration function, for operating the dataring structure 700. An illustrative initialization function can include an initial synchronization of the dataring structure 700; whereas, a determination of a type of data packet 800 to be propagated by the dataring structure 700 is an example of a typical configuration function. The additional functionality can be provided by any suitable number of the field-programmable gate arrays 650A-D. For purposes of illustration, the field-programmable gate array 650A is shown and described as being the master field-programmable gate array for providing the additional functionality.

During initial synchronization of the dataring structure 700, the master field-programmable gate array 650A transmits an initial data packet 800, such as data packet 800AB, which propagates through the dataring structure 700. Preferably, none of the other field-programmable gate arrays 650B-D transmits any data packets 800 prior to receiving the initial data packet 800AB. Upon receiving the initial data packet 800AB, each of the field-programmable gate arrays 650B-D is configured to identify the initial data packet 800AB as being the initial data packet. The initial data packet 800AB, for example, can include information for identifying itself as the initial data packet. If the identifying information is provided as a start bit 830 (shown in FIG. 5) with a high logic level, the field-programmable gate arrays 650B-D can identify the initial data packet 800AB via the start bit 830, which can comprise the first high logic level received by the field-programmable gate arrays 650B-D since system startup. The dataring structure 700, once initialized, can maintain data synchronization indefinitely.

Figure 5:
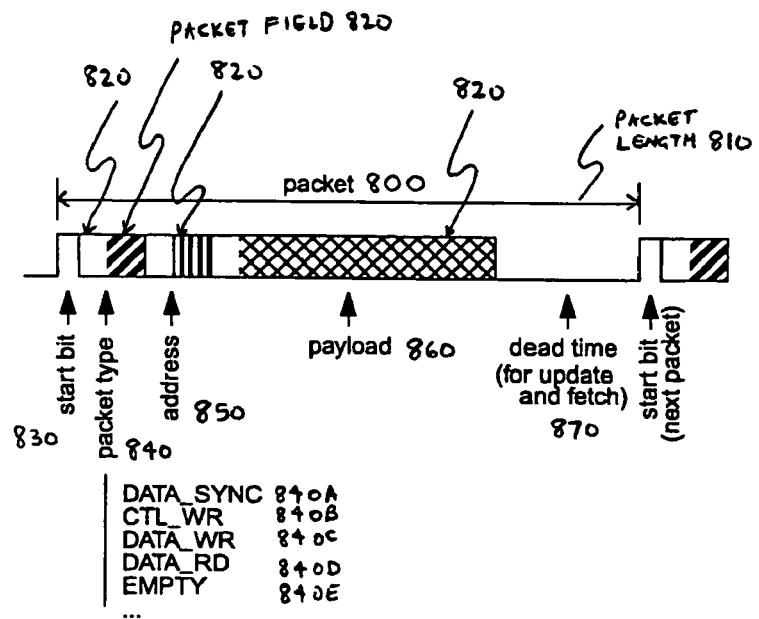
FIG. 5 is an exemplary data packet format illustrating an embodiment of a data packet for communicating data and other information among the field-programmable gate arrays forming the dataring structure of FIG. 4.

An exemplary data packet format for the data packets 800 is illustrated in FIG. 5. As shown in FIG. 5, the data packet 800 has a packet length 810 and includes a plurality of packet fields 820. The exemplary packet fields 820 can include a start bit field 830, a packet type field 840, an address field 850, and a payload field 860. Preferably comprising a fixed length, the packet length 810 can be variable for suitable system applications. As desired, the packet length 810 can be configured during initial synchronization of the dataring structure 700. The master field-programmable gate array 650A can transmit a selected data packet 800, such as a packet length configuration packet, that includes information regarding a predetermined packet length 810. For example, the packet type field 840 of the packet length configuration packet can identify the selected data packet 800 as being a packet length configuration packet, and the payload field 860 of the packet length configuration packet can provide a value representing the predetermined packet length 810. Once the packet length 810 has been established, each data packet 800 that subsequently propagates through the dataring structure 700 has the predetermined packet length 810 unless the packet length 810 is later updated via another packet length configuration packet.

As shown in FIG. 5, the start bit field 830 comprises the first packet fields 820 in the data packet 800 and is configured to indicate the beginning of a new data packet 800. Preferably comprising a one-bit field with a high logic level indicating the beginning of a new data packet 800, the start bit field 830 can include any suitable number of data bits and can indicate the beginning of a new data packet 800 in any conventional manner. The packet type field 840 and the address field 850 are shown as following the start bit field 830 in the data packet 800. The packet type field 840 can provide characteristic information regarding the data packet 800; whereas, the address field 850 can comprise a memory address associated with the packet type identified by packet type field 840. For example, the characteristic information provided by the packet type field 840 can include a packet length 810 and/or a type of operation, if any, to be initiated by the data packet 800, and the address field 850 can be a memory address associated with the operation type identified by packet type field 840. The packet type field 840 preferably is determined by the master field-programmable gate array 650A (shown in FIG. 4).

The memory address can identify a selected memory register within the memory space (shown in FIGS. 6A-B) of one or more of the field-programmable gate arrays 650A-D (shown in FIG. 4). The memory space of the target interface logic 600 is also discussed below and in co-pending United States Patent Application: "SYSTEM AND METHOD FOR PROVIDING FLEXIBLE SIGNAL ROUTING AND TIMING," application Ser. No. 11/140,714. An illustrative operation type that can be identified via the packet type fields 840 is the initial data synchronization 840A as discussed in more detail above. Writing a control instruction to a preselected memory register 840B, writing data to the preselected memory register 840C, reading data from the preselected memory register 840D, and/or incrementing (or decrementing) the register address associated with the address field 850 are other exemplary operation types that can be identified via the packet type fields 840. As desired, the packet type field 840 likewise can be empty 840E such that the data packet 800 is not associated with any operation.

Any convention packet type can be defined for the data packets 800 via the packet type field 840. If the packet type field 840 includes a request packet type (not shown), the field-programmable gate arrays 650B-D can communicate an initiation request for initiating one or more data packets 800. Data transmission thereby can be initiated by any of the field-programmable gate arrays 650A-D rather than only by the master field-programmable gate array 650A. Upon receiving the initiation request, the master field-programmable gate array 650A can transmit at least one transmission initiation data packet (not shown). The master field-programmable gate array 650A likewise can transmit blank transmission initiation data packets at predetermined time intervals.

As the transmission initiation data packet propagates around the datering structure 700 (shown in FIG. 4), the requesting field-programmable gate array 650B-D can provide transmission initiation contents, such as a register address and/or data, to the transmission initiation data packet to initiate data transmission. The transmission initiation data packet, once provided with the transmission initiation contents, makes a complete circuit around the datering structure 700 and returns the requesting field-programmable gate array 650B-D. To help ensure that makes a complete circuit, the master field-programmable gate array 650A retransmits the transmission initiation data packet around the datering structure 700 and to the requesting field-programmable gate array 650B-D. Any of the field-programmable gate arrays 650B-D thereby can initiate data transmission by providing the transmission initiation contents to the transmission initiation data packets.

The payload fields 860 can provide operands for, and/or the results of, the operations initiated by the data packets 800. When a selected field-programmable gate array 650A-D receives a data packet 800, the received data packet 800 provides the packet type field 840 and the address field 850 of the next data packet 800 that the selected field-programmable gate array 650A-D will receive. Similarly, the selected field-programmable gate array 650A-D does not generally modify the contents of the payload field 860 of the received data packet 800 unless the selected field-programmable gate array 650A-D is the source of the contents. In other words, upon receiving a selected data packet 800, the field-programmable gate arrays 650A-D can determine whether to apply the contents of the payload field 860 to the selected memory register and/or to fill the payload field 860 with the contents of the selected memory register depending upon the nature of the operation as identified by the packet type field 840.

The data packet 800 likewise is illustrated in FIG. 5 as including a dead time 870. Appearing within an end portion of the data packet 800, the dead time 870 can provide an interval of time for permitting the field-programmable gate arrays 650A-D to apply (or store) the contents from the data packet 800 to internal memory 900 (shown in FIGS. 6A-B) and/or to fetch (or retrieve) data from the internal memory 900. The data packet 800 thereby can include the retrieved data when retransmitted by the field-programmable gate array 650A-D. Although shown and described with reference to FIG. 5 as being provided with the exemplary data packet format, the data packets 800 can be provided in any suitable data packet format with an appropriate number of conventional packet fields 820. For example, the dead time 870 can be omitted from among the packet fields 820 if the field-programmable gate arrays 650A-D do not require the additional time interval for processing the data packets 800 and/or if the data packets 800 are transmitted in a pipelined mode.

In the manner set forth above, the data packet format shown in FIG. 5 is merely illustrative. Depending upon the application of the target interface logic 600, the data packets 800 can have a greater or smaller number of the packet fields 820 and/or can include one or more packet fields 820 that differ from the packet fields 830-870 recited in more detail above. The data packet 800, for example, can include an interrupt field (not shown) for permitting one or more of the field-programmable gate arrays 650B-D to request attention from the master field-programmable gate array 650A. Each being assigned one or more bits in the interrupt field, the field-programmable gate arrays 650B-D preferably can request immediate attention from the master field-programmable gate array 650A without regard to the packet type field 840 of the data packets 800.

As desired, the datering structure 700 (shown in FIG. 4) can include one or more other features. The number, type, and nature of the other features can depend upon the application of the target interface logic 600. The datering structure 700, for instance, can include an external interface (not shown) for receiving external configuration information and/or for providing internal status information. Thereby, the datering structure 700 can receive configuration information from, and/or provide status information to, an external system, such as the host system 200 (shown in FIG. 1) and/or the hardware emulation system 200' (shown in FIG. 2). The external interface can be provided with any conventional format and/or protocol that may be suitable for the selected application. Although the external interface may be associated with any of the field-programmable gate arrays 650A-D, the external interface preferably is provided via the master field-programmable gate array 650A.

An exemplary configuration memory space 900 for storing configuration information and other information associated with the field-programmable gate arrays 650 that form the datering structure 700 is illustrated in FIGS. 6A-B. In the manner set forth in more detail in co-pending U.S. Patent Application, entitled "SYSTEM AND METHOD FOR PROVIDING FLEXIBLE SIGNAL ROUTING AND TIMING," application Ser. No. 11/140,714, the target interface logic 600 includes a plurality of memory subspaces 910, 930, 940, 950, 960, and 970 for organizing the information. Generally being organized on a per-connection (or per-pin) basis, the memory space 900 of the target interface logic 600 can have general divisions, including static memory subspaces, such as static memory subspaces 910, 940, and dynamic memory subspaces, such as dynamic memory subspaces 930, 950.

The configuration memory space 900 likewise are shown as being generally divided among global memory subspaces and local memory subspaces. The illustrative global memory subspaces can include a global static (GS) memory subspace 910 and/or a global dynamic (GD) memory subspace 960; whereas, memory subspaces 930, 970 for configuring emulator data input connections (or pins) 630 (shown in FIG. 3) and memory subspaces 940, 950 for configuring the target I/O connections (or pins) 640 (shown in FIG. 3) can comprise exemplary local memory subspaces. Although shown and described as being divided into the memory subspaces 910, 930, 940, 950, 960, and 970 for purposes of illustration, the configuration memory space 900 can be organized in any suitable manner and provided as any appropriate number of memory subspaces. In other words, the memory subspaces 910, 930, 940, 950, 960, and 970 as shown in FIGS. 6A-B are merely exemplary and not exhaustive.

The global static (GS) memory subspace 910 is a static memory subspace and includes a plurality of memory registers 915 for storing information associated with the control and status of the target interface logic 600 as a whole. Exemplary information stored in the global memory subspace 910 can include a software version and an operational status of the target interface logic 600. The global dynamic (GD) memory subspace 960 is a dynamic memory subspace for storing dynamic information that can change with time, depending, for example, upon the number of the target interface (or TIF) cycle. Comprising a plurality of memory registers 945, the target pin static (PST) memory subspace 940 is used to store configuration and/or status information for each target I/O connection (or pin) 640 (shown in FIG. 3) on a time-independent basis. The target pin static (PST) memory subspace 940 can be used to store the configuration and/or status information for each of the target I/O pins 640 on a time-independent basis. As desired, any static data associated with the emulator data input pins 630 can be stored in the XBI pin dynamic (PDX) memory subspace 970. The number of memory registers 945 comprising the target pin static (PST) memory subspace 940 typically is equal to the number of target I/O connections (or pins) 640; whereas, the XBI pin dynamic (PDX) memory subspace 970 includes a number of memory registers that is approximately equal to the number of emulator data input pins 630.

The dynamic pin memory subspaces 930, 950 respectively are shown as being further divided into a plurality of memory subspaces 935, 955, which can be used to store configuration and/or status information for each input pin 630, 640 (shown in FIG. 3) on a time-dependent basis. Thereby, the dynamic pin memory (PDX) subspace 930 can be used to store configuration and/or status information for each of the emulator data input pins 630 on a time-dependent basis. Configuration and/or status information for each of the target I/O pins 640 likewise can be stored in the dynamic pin memory (PDT) subspace 950 on a time-dependent basis. Essentially comprising a control store for the input pins 630, 640, the dynamic pin memory subspaces 930, 950 include information that is needed by the input pins 630, 640 for each target interface (or TIF) cycle.

The number of memory subspaces 935 forming the dynamic pin memory (PDX) subspace 930 typically is equal to the number of emulator data input pins 630, and the number of memory registers 935' (shown in FIG. 6B) comprising each of the memory subspaces 935 is approximately equal to the number of target interface (or TIF) cycles in the emulation. Similarly, the target pin dynamic (PDT) memory space 950 includes a number of dynamic pin memory (PDT) memory subspaces 955 that is about equal to the number of target I/O connections (or pins) 640; whereas, each dynamic pin memory (PDT) subspace 955 has a number of memory registers 955' that is approximately equal to the number of target interface (or TIF) cycles in the emulation. An exemplary dynamic pin memory (PDT) subspace $955i$ is illustrated in FIG. 6A as comprising a plurality of memory registers $955i_0'$, $955i_1'$, ..., $955i_T'$ for storing information regarding a selected target I/O pin 640 at times $t=0, t=1, \ldots, t=T$. The number of memory registers 945 comprising the target pin static (PST) memory subspace 940 typically is equal to the number of target I/O connections (or pins) 640; whereas, the XBI pin dynamic (PDX) memory subspace 970 includes a number of memory registers that is approximately equal to the number of emulator data input pins 630.

As shown in FIG. 6A, each memory subspaces 910, 930, 940, 950, 960, and 970 in the configuration memory space 900 can include auto-incrementing functionality. The auto-increment function can be provided in any conventional manner and preferably is provided in a manner that is reasonable in light of the functional characteristics of the relevant memory subspaces 910, 930, 940, 950, 960, and 970. For the dynamic memory subspaces 930, 950, for example, the auto-increment function can be at least partially temporally based; whereas, the auto-increment function for the static memory subspaces 940 can be provided in a manner that increments across adjacent input pins 630, 640. As desired, the global memory subspace 910 can be auto-incremented across arbitrary addresses.

The global memory subspaces, such as the global memory subspace 910, of the configuration memory space 900 enable the target interface logic 600 to maintain some unified state. For purposes of convenience, the registers 915 of the global memory subspace 910 can be considered as residing in the dataring structure 700 (shown in FIG. 4). The dataring structure preferably includes a master field-programmable gate array, such as the field-programmable gate array 650A (shown in FIG. 3), for providing additional functionality, such as an initialization function and/or a configuration function, for operating the dataring structure. One or more of the field-programmable gate arrays 650A-D (shown in FIGS. 3 and 4), such as the master field-programmable gate array 650A, of the dataring structure can periodically update one or more of the registers 915 of the global memory subspace 910 as desired. For example, the master field-programmable gate array 650A can initiate at least one data packet 800 (shown in FIG. 5) for updating a selected register 915. The data packet can be provided in any conventional manner and preferably includes an address field for storing the address of the selected register 915 and a payload field for storing information and other data. The data packet 800 preferably includes, among other items, a packet type field 840 associated with the initial data synchronization 840A (shown in FIG. 5), an address field 850 (shown in FIG. 5) has the address of the selected register 915 and a payload field 860 for storing information and other data.

The field-programmable gate arrays 650A-D each preferably include a plurality of internal memory registers (not shown). Upon receiving the data packet 800, each of the field-programmable gate arrays 650A-D can update its internal copy of the selected register 915 from information from the payload field 860 (shown in FIG. 5) of the data packet 800. If the information to be stored in the selected register 915 originates with one of the field-programmable gate arrays 650A-D, the relevant field-programmable gate array 650A-D likewise can update the selected register 915 upon receiving the data packet 800. The relevant field-programmable gate array 650A-D can store the information in the payload field 860 of the data packet 800, and the remaining field-programmable gate arrays 650A-D can update their respective internal copies of the selected register 915 as the data packet 800 propagates around the dataring structure 700 in the manner set forth in more detail above with reference to FIGS. 4 and 5.

The internal memory registers of each field-programmable gate array 650A-D likewise can store information that is local to the field-programmable gate array 650A-D and that is not needed by the other field-programmable gate arrays 650A-D. Although data synchronization typically is unnecessary, the local information can advantageously be communicated around the dataring structure 700 via one or more data packets 800. The local information can be communicated by the relevant field-programmable gate array 650A-D, for instance, if the dataring structure 700 includes an external interface (not shown), such as a Joint Test Access Group (JTAG) interface that is compliant with Institute of Electrical and Electronics Engineers (IEEE) Standard 1149.1, for receiving external configuration information and/or for providing internal status information in the manner set forth above.

To communicate the local information around the dataring structure 700, one or more of the field-programmable gate arrays 650A-D, such as the master field-programmable gate array 650A, can propagate a data packet 800 around the dataring structure 700, as desired. The data packet 800 can be initiated, for example, when the local information is requested. With the address field 850 having the address of the desired internal memory register, the relevant field-programmable gate array 650A-D can update the payload field 860 of the data packet 800 to include the local information from the desired internal memory register. The data packet 800 likewise can be ignored by the other field-programmable gate arrays 650A-D as the data packet 800 propagates around the dataring structure 700.

A preferred hierarchy of the configuration memory space 900 is shown in FIG. 6B. The operation of the hierarchical configuration memory space 900 is illustrated with reference to a conventional 16-bit address structure. Although shown and described with reference to an address structure that is sixteen bits wide for purposes of illustration, the hierarchical configuration memory space 900 is suitable for address structures of any conventional address width. As shown in Tables 1-3, the exemplary 16-bit address structure can be divided into a plurality of address segments. The address segments can have any appropriate size, and the sizes of the address segments can be uniform or different, as desired. For purposes of illustration, the exemplary 16-bit address structure is shown and described with reference to Tables 1-3 as being evenly divided into four 4-bit address segments: Address Bits [15:12]; Address Bits [11:8]; Address Bits [7:4]; and Address Bits [3:0]. The Address Bits [15:12] can be used for hierarchical level selection; whereas, the remaining address segments, Address Bits [11:8], Address Bits [7:4], and Address Bits [3:0], can function as traditional address bits.

Turning to Table 1, an illustrative sequence of data accesses associated with an exemplary read operation from the global memory (GS) subspace 810 is shown and will be discussed with reference to FIG. 6B. For each Control Write operation, the information in the address field 850 includes hierarchical level information provided by Address Bits [15:12], the type of operation is identified by Address Bits [11:8], and the subspace within which the identified operation is to be performed. A level-zero control write is used to select which top-level configuration memory space 900, such as the global memory (GS) subspace 810, in Hierarchical Level 0 is to be addressed and whether the subsequent data access will be a read or a write. If the configuration memory space 900 to be addressed is a first-order subspace, such as the global memory (GS) subspace 810 and/or the target pin static (PST) memory subspace 940, in Hierarchical Level 1, then the level-one address identifies the memory register to be selected.

As shown in Table 1, the first Control Write operation is associated with Hierarchical Level 0, comprises a read operation, and the read operation is to be performed within the global memory (GS) subspace 910. Next, in the second Control Write operation, Address Bits [15:12] provide that the operation is associated with Hierarchical Level 1, and the selected memory register 915 within the global memory (GS) subspace 910 is identified via Address Bits [11:8], Address Bits [7:4], and Address Bits [3:0] as being Memory Register 3 within the global memory (GS) subspace 910. The Data Read operation of Table 1 then permits the data stored in the selected memory register 915 to be read. The data read from the selected memory register 915 is shown as A3E2 in Table 1.

TABLE 1

Exemplary Read from GS Space (Hierarchy Level 1)

| | Exemplary 16-Bit Address Field | | | | |
|---|---|---|---|---|---|
| Access Type | 15:12 | 11:8 | 7:4 | 3:0 | Comments |
| Control Write | Level 0 | R/W 1 | Subspace 00 | | Selects READ from GS Subspace |
| Control Write | Level 1 | Register Address 003 | | | Selects GS Register 3 |
| Data Read | | Data A3E2 | | | Returns data from GS Register 3 |

The memory subspace within the configuration memory space 900 likewise can comprise a second-order memory subspace. If a second-order memory subspace is to be addressed, the level-one address can select a predetermined memory sub-subspace, such as the dynamic pin memory (PDT) subspace 950, within the second-order memory subspace, and a level-two address can identify a specific memory register, such as the memory registers 955', within the predetermined memory subspace. An exemplary write operation to the dynamic pin memory (PDT) subspace 950 is shown in Table 2.

TABLE 2

Exemplary Write to PDT Space (Hierarchy Level 2)

| | Exemplary 16-Bit Address Field | | | | |
|---|---|---|---|---|---|
| Access Type | 15:12 | 11:8 | 7:4 | 3:0 | Comments |
| Control Write | Level 0 | R/W 0 | Subspace 03 | | Selects READ from GS Subspace |
| Control Write | Level 1 | Target I/O Pin Number 037 | | | Selects I/O Pin No. 55 [hex 0x37] |
| Control Write | Level 2 | Time Index 060 | | | Selects TIF Cycle No. 96 [hex 0x60] |
| Data Write | | Data BEEF | | | Writes Data 0xBEEF to PDT[55, 96] |

In the manner discussed above with reference to FIG. 6A, the architecture of the hierarchical configuration memory space 900 can include auto-incrementing functionality. The auto-incrementing functionality preferably comprises intelligent auto-incrementing functionality. In level-one memory subspaces, such as the global static (GS) memory subspace 910, for example, the address increments sequentially through the addresses of each register 915 in the conventional manner. For level-two memory subspaces, such as the dynamic pin memory (PDT) subspace 950, however, the address increments sequentially through the address of each target interface (or TIF) cycle register 955', for the selected dynamic pin memory (PDT) memory subspace 955. Upon reaching the last target interface (or TIF) cycle register 955' for the selected dynamic pin memory (PDT) memory subspace 955, the auto-incrementing functionality proceeds with the first target interface (or TIF) cycle register 955' in the next higher level dynamic pin memory (PDT) memory subspace 955 and can increment sequentially through the addresses of the target interface (or TIF) cycle registers 955', for the higher-level dynamic pin-memory (PDT) memory subspace 955. The auto-incrementing functionality for the hierarchical configuration memory space 900 is illustrated with reference to the dynamic pin memory (PDT) subspace 950 in Table 3.

TABLE 3

Exemplary Write to PDT Space with
Auto-Increment (Hierarchy Level 2)

Exemplary 16-Bit Address Field

| Access Type | 15:12 | 11:8 | 7:4 | 3:0 | Comments |
|---|---|---|---|---|---|
| Control Write | Level 0 | R/W 1 | Subspace 00 | | Selects WRITE to PDT Subspace |
| Control Write | Level 1 | Target I/O Pin Number 037 | | | Selects I/O Pin No. 55 [hex 0x37] |
| Control Write | Level 2 | Time Index 060 | | | Selects TIF Cycle No. 96 [hex 0x60] |
| Data Write | | Data AA11 | | | Writes Data 0xAA11 to PDT[55, 96] |
| Data Write | | Data BB22 | | | Writes Data 0xBB22 to PDT[55, 97] |
| Data Write | | Data CC33 | | | Writes Data 0xCC33 to PDT[55, 98] |
| Data Write | | Data DD44 | | | Writes Data 0xDD44 to PDT[55, 99] |
| Data Write | | Data EE55 | | | Writes Data 0xEE55 to PDT[56, 00] |
| Data Write | | Data FF66 | | | Writes Data 0xFF66 to PDT[56, 01] |

Advantageously, the number of levels is limited only by the number of address bits included in the address segment associated with hierarchical level selection. Similarly, the depth of each hierarchical level is limited only by the number of address bits included in the associated address segment. It will be appreciated that memory addressing via the auto-incrementing functionality can be utilized to even further deepen the depth of the hierarchical levels, as desired. Further, each of the memory subspaces 910, 930, 940, 950, 960, and 970 can be formed with any suitable size. The architecture of the hierarchical configuration memory space 900 likewise is extensible because one or more memory subspaces 910, 930, 940, 950, 960, and 970 can be added and/or removed from the architecture without the need to re-arrange the resultant configuration memory space 900.

In operation, the dataring structure 700 (shown in FIG. 4) includes a layered protocol that enables a plurality of reconfigurable logic devices, such as field-programmable gate arrays (FPGAs) 650 (shown in FIG. 3), to appear to be a single reconfigurable logic device. In the manner set forth in more detail above, the dataring structure 700 can include an external interface (not shown) for receiving external configuration information and/or for providing internal status information. If the reconfigurable logic devices comprise Joint Test Access Group (JTAG) devices, for example, the external interface can comprise a Joint Test Access Group (JTAG) interface that is compliant with Institute of Electrical and Electronics Engineers (IEEE) Standard 1149.1. Although discussed with reference to Joint Test Access Group (JTAG) devices for purposes of illustration, the operation of the dataring structure 700 can be configured to comply with any conventional protocol.

Typically comprising a four (or five) wire serial interface, the Joint Test Access Group (JTAG) interface can be used to form a wide range of functions. Exemplary functions can include testing connections on a printed circuit board (PCB) by using boundary scan to drive/sample external input/output pins 620, 630, 640 (shown in FIG. 3) of the field-programmable gate arrays (FPGAs) 650, testing the internal functionality of the field-programmable gate arrays (FPGAs) 650 through internal test registers, and/or configuring programmable/configurable devices such as programmable read-only memories (PROMs), programmable logic devices (PLDs), and field-programmable gate arrays (FPGAs) 650. The Joint Test Access Group (JTAG) interface likewise can configure rarely accessed modes of the field-programmable gate arrays (FPGAs) 650 and/or query the status of the field-programmable gate arrays (FPGAs) 650, as desired.

The Joint Test Access Group (JTAG) standard defines two memory registers in each of the field-programmable gate arrays (FPGAs) 650 forming the dataring structure 700. The first memory register is the instruction register (IR) 600 as shown in FIGS. 7A-B; whereas, the data register (DR) 670 comprises the second memory register. The instruction register (IR) 600 can be of any suitable length, preferably a fixed length, and can be used to issue selected commands. Illustrative selected commands that can be issued by the instruction register (IR) 600 can include a RECONFIGURE command and/or a commands for manipulating the data stored in the data register (DR) 670. As desired, the instruction register (IR) 600 likewise can include a BYPASS command whereby data register (DR) shifts can bypass the relevant field-programmable gate array (FPGAs) 650.

Comprising a serial protocol, the Joint Test Access Group (JTAG) protocol generally permits data to be shifted into a JTAG chain through a test-data-in (TDI) pin of the first field-programmable gate array (FPGAs) 650A forming the dataring structure 700 and to emerge from a test-data-out (TDO) pin of the last field-programmable gate array (FPGA) 650D. Asking software to recognize the target interface logic 600 as a plurality of field-programmable gate arrays (FPGAs) 650, however, could complicate the design of the target interface logic 600. Therefore, it is advantageous to present the target interface logic 600 externally as a single logical (or virtual or composite) device.

The target interface logic 600 can be presented externally as a single logical device by chaining the instruction registers (IRs) 600 of the field-programmable gate arrays (FPGAs) 650 to form a composite instruction register (IR) 600' as shown in FIG. 7B. For example, if the dataring structure 700 is formed via four field-programmable gate arrays (FPGAs) 650A-D each having a six-bit instruction registers (IRs) 600, the composite instruction register (IR) 600' of the composite field-programmable gate array (FPGA) 650' comprises a twenty-four bit register. For IR boundary-scan values, such as internal test (INTEST) and external test (EXTEXT), the instruction value for the composite field-programmable gate array (FPGA) 650' can be provided as a concatenation of the instruction values for each individual field-programmable gate array (FPGA) 650. Each field-programmable gate array (FPGA) 650 thereby enters the relevant mode. Upon providing correct boundary-scan pin maps for each pin of the field-programmable gate arrays (FPGAs) 650, the field-programmable gate arrays (FPGAs) 650 can appear to comprise the composite field-programmable gate array (FPGA) 650' to the outside world.

To access the dataring-accessible value via the JTAG interface, two instruction register codes, USR1 and USR2, are provided and are usable by the internal logic of the field-programmable gate arrays (FPGAs) 650. The additional instruction register codes likewise can be defined for the composite field-programmable gate array (FPGA) 650' and can comprise the concatenation of other defined instruction register codes for the field-programmable gate arrays (FPGAs) 650. For example, a control write (CTL_WR) command can be defined as the concatenation of USR1|BYPASS|BYPASS|BYPASS; whereas, the concantentaions of USR2|BYPASS|BYPASS|BYPASS and BYPASS|BYPASS|BYPASS|USR2 can respectively comprise a data write (DATA_WR) command and a data read (DATA_RD) command. These additional instruction register codes comprise concatenated bit instruction codes for the composite field-programmable gate array (FPGA) 650' and can be used by the outside world to interface with the target interface logic 600.

When a control write command is initiated, the associated data can be broadcast by the master field-programmable gate array 650A through the entire dataring structure 700. In the manner discussed in more detail above with reference to FIG. 4, the data associated with the control write command identifies the relevant memory register to be accessed by the subsequent data access. The data associated with a data write command is initiated is provided to the master field-programmable gate array 650A via the JTAG interface. The data associated with the data write command then propagates through the entire dataring structure 700 to the relevant field-programmable gate array 650A-D for local memory registers and/or to each field-programmable gate array 650A-D for global memory registers. Since the JTAG BYPASS command is defined to appear like a single flip-flop (or latch) device, the data associated with the data read command preferably originate with the last field-programmable gate array 650D in the dataring structure 700. By originating the associated data with the last field-programmable gate array 650D, proper alignment of the associated data can be assured because the datapath preferable includes no BYPASS flip-flops.

Proper operation of the target interface logic 600 can be further ensured by allowing the data associated with each command to propagate through the entire dataring structure 700. Thereby, proper data can be received by and, if necessary, stored by each field-programmable gate array 650A-D forming the dataring structure 700. Although the transmission of the data around the dataring structure 700 can take some time, ample time exists for the data to reach the last field-programmable gate array 650D due, at least in part, to the number of clock cycles required to serially load the concatenated bit instruction codes into the composite instruction register (IR) 600' of the composite field-programmable gate array (FPGA) 650' and/or the number of clock cycles to perform any JTAG state changes. The field-programmable gate arrays 650A-D forming the dataring structure 700 thereby appear to the outside world as the composite field-programmable gate array (FPGA) 650' in a manner that is transparent to software.

The various embodiments disclosed herein are susceptible to various modifications and alternative forms, and specific examples thereof have been shown by way of example in the drawings and are herein described in detail. It should be understood, however, that the various embodiments disclosed herein are not to be limited to the particular forms or methods disclosed, but to the contrary, the invention is to cover all modifications, equivalents, and alternatives falling within the spirit and scope of the claims.

What is claimed is:

1. A target interface system for interfacing a hardware emulation system and a target system, comprising:
   target interface logic that is distributed among a plurality of reconfigurable logic devices;
   a plurality of input/output connections that are in communication with the reconfigurable logic devices; and
   a memory structure that stores data for configuring said input/output connections via said target interface logic and that is divided into a plurality of hierarchical memory subspaces for organizing the configuration data, said hierarchical memory subspaces including a first memory subspace that stores dynamic configuration data for at least one first selected input/output connection with a configuration that is adjustable for each target interface cycle within an emulation cycle and a second memory subspace that stores static configuration data for at least one second selected input/output connection with a configuration that is fixed throughout the emulation cycle,
   wherein said hierarchical memory subspaces within said memory structure can be modified to implement a preselected memory hierarchy.

2. The target interface system of claim 1, wherein said input/output connections include a predetermined number of emulator data input connections that communicate with the hardware emulation system, and wherein said memory structure stores the configuration data for configuring said emulator data input connections.

3. The target interface system of claim 2, wherein said first memory subspace includes a plurality of third memory subspaces, each of said third memory subspaces being associated with a selected emulator data input connection and comprising a predetermined number of memory registers that store the dynamic configuration data for said selected emulator data input connection, said predetermined number of said memory registers being equal to a predetermined number of the target interface cycles within the emulation cycle.

4. The target interface system of claim 3, wherein said memory structure automatically increments through said memory registers associated with said selected emulator data input connection.

5. The target interface system of claim 2, wherein said second memory subspace includes a fourth memory subspace comprising a predetermined number of memory registers that store the static configuration data for said emulator data input connections, said predetermined number of said memory registers being equal to said predetermined number of said emulator data input connections.

6. The target interface system of claim 5, wherein said first memory sub space includes a plurality of fifth memory subspaces, each of said fifth memory subspaces being associated with a selected target input/output connection and comprising a predetermined number of memory registers that store the dynamic configuration data for said selected target input/output connection, said predetermined number of said memory registers being equal to a predetermined number of the target interface cycles within the emulation cycle.

7. The target interface system of claim 6, wherein said memory structure automatically increments through said memory registers associated with said selected target input/output connection.

8. The target interface system of claim 5, wherein said second memory subspace includes a sixth memory subspace comprising a predetermined number of memory registers that store the static configuration data for said target input/output connections, said predetermined number of said memory registers being equal to said predetermined number of said target input/output connection.

9. The target interface system of claim 1, wherein said input/output connections include a predetermined number of target input/output connections that communicate with the target system, and wherein said memory structure stores the configuration data for configuring said target input/output connections.

10. The target interface system of claim 1, wherein said memory structure further includes seventh and eighth memory subspaces that store global configuration data for maintaining a predetermined unified state for said target interface logic as a whole, said seventh memory subspace storing global dynamic configuration data that is adjustable for each of said target interface cycle, said eighth memory subspace storing global static configuration data that is fixed throughout the emulation cycle.

11. The target interface system of claim 1, wherein the configuration data for said input/output connections includes data for configuring a preselected input/output connection as one of an input connection, an output connection, a bidirectional connection, an open-drain connection, a connection with a pull-up resister, and a connection with a pull-down resistor.

12. The target interface system of claim 1, wherein said hierarchical memory subspaces within said memory structure are modified by at least one of adding a new hierarchical memory subspace to said memory structure and removing a selected hierarchical memory subspace from said memory structure.

13. The target interface system of claim 1, wherein each of the reconfigurable logic devices has an input connection that receives incoming data packets and an output connection that provides outgoing data packets.

14. The target interface system of claim 13, further comprising a serial link that couples said input connection and said output connection of successive reconfigurable logic devices to form a dataring structure that distributes said data packets among said reconfigurable logic devices, wherein said dataring structure maintains data synchronization among said reconfigurable logic devices such that the distribution of said target interface logic among said reconfigurable logic devices is transparent to software.

15. The target interface system of claim 13, wherein said reconfigurable logic devices are synchronized via a common clock signal.

16. A target interface system for interfacing a hardware emulation system and a target system, comprising:
   target interface logic that is distributed among a plurality of reconfigurable logic devices;
   a plurality of input/output connections that are in communication with the reconfigurable logic devices; and
   a memory structure that stores data for configuring said input/output connections via said target interface logic and that is divided into a plurality of hierarchical memory subspaces for organizing the configuration data, said hierarchical memory subspaces including a first memory subspace that stores global configuration data for maintaining a predetermined unified state for said target interface logic as a whole and a second memory subspace that stores dynamic configuration data for at least one selected input/output connection with a configuration that is adjustable for each target interface cycle within an emulation cycle,
   wherein said second memory subspace includes a plurality of third memory subspaces, each of said third memory subspaces being associated with a relevant selected input/output connection and comprising a predetermined number of memory registers that store the dynamic configuration data for said relevant selected input/output connection, said predetermined number of said memory registers being equal to a predetermined number of the target interface cycles within the emulation cycle.

17. The target interface system of claim 16, wherein said input/output connections include a predetermined number of emulator data input connections that communicate with the hardware emulation system, and wherein said memory structure stores the configuration data for configuring said emulator data input connections.

18. The target interface system of claim 16, wherein said input/output connections include a predetermined number of target input/output connections that communicate with the target system, and wherein said memory structure stores the configuration data for configuring said target input/output connections.

19. The target interface system of claim 16, wherein said memory structure automatically increments through said memory registers associated with said relevant selected input/output connection.

20. The target interface system of claim 16, wherein said memory structure further includes a fourth memory subspace comprising a predetermined number of memory registers that store the static configuration data for said input/output connections, said predetermined number of said memory registers being equal to said predetermined number of said input/output connections.

21. The target interface system of claim 16, wherein said first memory subspace includes a fifth memory subspace that stores global dynamic configuration data that is adjustable for each of said target interface cycle and a sixth memory subspace that stores global static configuration data that is fixed throughout the emulation cycle.

* * * * *

UNITED STATES PATENT AND TRADEMARK OFFICE
CERTIFICATE OF CORRECTION

PATENT NO. : 7,640,155 B2  
APPLICATION NO. : 11/141599  
DATED : December 29, 2009  
INVENTOR(S) : Poplack et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1077 days.

Signed and Sealed this

Ninth Day of November, 2010

David J. Kappos  
*Director of the United States Patent and Trademark Office*